(12) United States Patent
Nitta et al.

(10) Patent No.: US 12,051,568 B2
(45) Date of Patent: Jul. 30, 2024

(54) SEMICONDUCTOR MANUFACTURING APPARATUS

(71) Applicant: TOTO LTD., Kitakyushu (JP)

(72) Inventors: Yasutaka Nitta, Kitakyushu (JP); Takuma Wada, Kitakyushu (JP); Ryoto Takizawa, Kitakyushu (JP)

(73) Assignee: Toto Ltd., Kitakyushu-shl (JP)

( * ) Notice: Subject to any disclaimer, the term of this patent is extended or adjusted under 35 U.S.C. 154(b) by 96 days.

(21) Appl. No.: 16/802,666

(22) Filed: Feb. 27, 2020

(65) Prior Publication Data
US 2020/0273675 A1    Aug. 27, 2020

(30) Foreign Application Priority Data

Feb. 27, 2019  (JP) ................................ 2019-033547
Dec. 27, 2019  (JP) ................................ 2019-238045

(51) Int. Cl.
| | | |
|---|---|---|
| *H01J 37/32* | (2006.01) | |
| *C23C 16/458* | (2006.01) | |
| *H01L 21/67* | (2006.01) | |
| *H01L 21/683* | (2006.01) | |

(52) U.S. Cl.
CPC .... *H01J 37/32477* (2013.01); *C23C 16/4583* (2013.01); *H01J 37/32715* (2013.01); *H01L 21/67011* (2013.01); *H01L 21/6831* (2013.01); *H01J 2237/2007* (2013.01)

(58) Field of Classification Search
None
See application file for complete search history.

(56) References Cited

U.S. PATENT DOCUMENTS

| 7,166,200 B2 * | 1/2007 | Saigusa ............... H01J 37/3244 118/69 |
|---|---|---|
| 8,926,790 B2 * | 1/2015 | Tetsuka ............... H01J 37/3244 156/345.48 |
| 2001/0003271 A1 | 6/2001 | Otsuki |

(Continued)

FOREIGN PATENT DOCUMENTS

| CN | 1768341 A | 5/2006 |
|---|---|---|
| JP | 2004-363552 A | 12/2004 |

(Continued)

OTHER PUBLICATIONS

English machine translation of Office Action issued Sep. 7, 2020 in corresponding Taiwanese patent application No. 109105339.

*Primary Examiner* — Jeffrie R Lund
*Assistant Examiner* — Tiffany Z Nuckols
(74) *Attorney, Agent, or Firm* — Carrier, Shende & Associates P.C.; Fulchand P. Shende; Joseph P. Carrier (57) ABSTRACT

According to one embodiment, a semiconductor manufacturing apparatus member includes a base and a particle-resistant layer. The base includes a first surface, a second surface crossing the first surface, and an edge portion connecting the first surface and the second surface. The particle-resistant layer includes a polycrystalline ceramic and covering the first surface, the second surface, and the edge portion. The particle-resistant layer includes a first particle-resistant layer provided at the edge portion, and a second particle-resistant layer provided at the first surface. A particle resistance of the first particle-resistant layer is higher than a particle resistance of the second particle-resistant layer.

8 Claims, 6 Drawing Sheets

(56) References Cited

U.S. PATENT DOCUMENTS

| | | | |
|---|---|---|---|
| 2003/0159928 A1* | 8/2003 | Kojima | G01N 27/4067 |
| | | | 204/408 |
| 2004/0002221 A1 | 1/2004 | O'Donnell et al. | |
| 2005/0136188 A1* | 6/2005 | Chang | H01J 37/32477 |
| | | | 156/345.52 |
| 2005/0276928 A1 | 12/2005 | Okumura et al. | |
| 2007/0142956 A1* | 6/2007 | Escher | H01L 21/67069 |
| | | | 700/121 |
| 2007/0215273 A1* | 9/2007 | Jacobs | H01L 25/50 |
| | | | 156/297 |
| 2007/0215278 A1 | 9/2007 | Furuse et al. | |
| 2008/0180030 A1* | 7/2008 | Tetsuka | H01J 37/32522 |
| | | | 315/111.41 |
| 2008/0236744 A1* | 10/2008 | Furuse | H01J 37/32623 |
| | | | 156/345.1 |
| 2008/0276865 A1* | 11/2008 | Nishimizu | H01L 21/6831 |
| | | | 118/500 |
| 2010/0310785 A1* | 12/2010 | Sasakawa | H01J 37/32449 |
| | | | 427/457 |
| 2018/0012785 A1 | 1/2018 | Matyushkin et al. | |
| 2019/0027343 A1 | 1/2019 | Nitta | |
| 2021/0351013 A1* | 11/2021 | Chida | C04B 41/5059 |

FOREIGN PATENT DOCUMENTS

| | | | | | |
|---|---|---|---|---|---|
| JP | 2005-158933 A | | 6/2005 | | |
| JP | 2005-531157 A | | 10/2005 | | |
| JP | 2012-018928 A | | 1/2012 | | |
| JP | 2015141956 A | * | 8/2015 | | |
| JP | 2018-014492 A | | 1/2018 | | |
| JP | 2018-046278 A | | 3/2018 | | |
| JP | 2020002415 A | * | 1/2020 | | C04B 41/5059 |
| KR | 2010-0011576 A | | 2/2010 | | |
| TW | 201623660 A | | 7/2016 | | |
| WO | WO-2020003669 A1 | * | 1/2020 | | C04B 41/5059 |

\* cited by examiner

SEMICONDUCTOR MANUFACTURING APPARATUS

CROSS-REFERENCE TO RELATED APPLICATIONS

This application is based upon and claims the benefit of priority from Japanese Patent Application No. 2019-33547, filed on Feb. 27, 2019, and No. 2019-238045, filed on Dec. 27, 2019; the entire contents of which are incorporated herein by reference.

FIELD

Embodiments described herein relate generally to a semiconductor manufacturing apparatus member, and a display manufacturing apparatus and a semiconductor manufacturing apparatus comprising semiconductor manufacturing apparatus member.

BACKGROUND

A semiconductor manufacturing apparatus is used in a manufacturing process of a semiconductor device to perform processing such as dry etching, sputtering, CVD (Chemical Vapor Deposition), etc., in a chamber. Particles may be generated in the chamber from a patterning object, the interior wall of the chamber, etc. It is desirable to reduce such particles because the particles cause a reduction of the yield of the semiconductor device to be manufactured.

To reduce the particles, it is desirable for the semiconductor manufacturing apparatus members used in the chamber and in the periphery of the chamber to be plasma-resistant. Therefore, a method is used in which the front surface of the semiconductor manufacturing apparatus member is coated with a covering film (layer) having excellent plasma resistance. For example, a member is used in which an yttria thermal-sprayed film is formed on the front surface of a base. However, there are cases where cracks and/or peeling occur in the thermal-sprayed film; and the durability is not quite sufficient. It is desirable to suppress peeling between the covering film and the base because peeling of the covering film and/or particle detachment from the covering film causes particle generation. Conversely, semiconductor or liquid crystal manufacturing apparatus members that use a ceramic film formed by aerosol deposition are discussed in JP-A 2005-158933 and KR-A 20100011576. Also, the formation of a thermal-sprayed film including a periodic table Group 3a element compound on the interior wall of a base having a ring configuration or a dome configuration is discussed in JP-A 2012-18928.

Recently, semiconductor devices are being downscaled; and nanolevel particle control is desirable.

SUMMARY

According to the embodiment, a semiconductor manufacturing apparatus member includes a base and a particle-resistant layer. The base includes a first surface, a second surface crossing the first surface, and an edge portion connecting the first surface and the second surface. The particle-resistant layer includes a polycrystalline ceramic and covering the first surface, the second surface, and the edge portion. The particle-resistant layer includes a first particle-resistant layer provided at the edge portion, and a second particle-resistant layer provided at the first surface. A particle resistance of the first particle-resistant layer is higher than a particle resistance of the second particle-resistant layer.

DETAILED DESCRIPTION

A semiconductor manufacturing apparatus member according to the invention includes a base and a particle-resistant layer; the base includes a first surface, a second surface crossing the first surface, and an edge portion connecting the first surface and the second surface; the particle-resistant layer includes a polycrystalline ceramic and covers the first surface, the second surface, and the edge portion; and the particle-resistant layer includes a first particle-resistant layer provided at the edge portion, and a second particle-resistant layer provided at the first surface. A particle resistance of the first particle-resistant layer is higher than a particle resistance of the second particle-resistant layer.

The surface of the semiconductor manufacturing apparatus member is exposed to a corrosive plasma atmosphere. The inventors discovered that at such a time, the plasma concentrates easily at the edge portion of the base, and the risk of becoming a particle production source is high because the edge portion undergoes more damage due to the plasma than does the first surface.

Therefore, in the invention, the particle-resistant layer that covers the first surface, the second surface, and the edge portion of the base is configured to include the first particle-resistant layer provided at the edge portion and the second particle-resistant layer provided at the first surface; and the particle resistance of the first particle-resistant layer is set to be higher than the particle resistance of the second particle-resistant layer. Therefore, the plasma damage of the edge portion can be reduced; and a semiconductor manufacturing apparatus member that has excellent particle resistance can be provided.

In a semiconductor manufacturing apparatus member according to the invention, it is also favorable for the base to have a ring configuration, for the first surface to be an inner perimeter surface of the base, and for the second surface to be an upper surface or a lower surface of the base.

If the base has a ring configuration, the base can be utilized favorably at the interior wall of the chamber of the semiconductor manufacturing apparatus. When the base has a ring configuration, the plasma concentrates easily at the edge portion that connects the inner perimeter surface and the upper surface of the base or at the edge portion that connects the inner perimeter surface and the lower surface of the base.

In the invention, by setting the particle resistance of the first particle-resistant layer provided at the edge portion to be higher than the particle resistance of the second particle-resistant layer, the plasma damage of the edge portion can be reduced even when the base has the ring configuration.

In a semiconductor manufacturing apparatus member according to the invention, it is also favorable for the base to have a first opening at an upper end and a second opening at a lower end, for a diameter of the first opening to be smaller than a diameter of the second opening, and for the second surface to be the upper surface of the base.

In a semiconductor manufacturing apparatus, there are cases where the interior wall at the upper side of the chamber is configured in a tapered configuration so that the diameter decreases upward. That is, there are cases where the diameter of the first opening at the upper-end side of the base is set to be smaller than the diameter of the second opening at the lower-end side of the base. The inventors discovered that when the interior wall of the chamber has a tapered configuration, the contact area is large between the plasma and particularly the upper surface of the tapered configuration; and the plasma concentrates easily at the edge portion connecting the upper surface and the inner perimeter surface.

In the invention, the edge portion that connects the upper surface and the inner perimeter surface of the ring-shaped base is covered with the first particle-resistant layer which has superior particle resistance; therefore, the decrease of the particle resistance can be suppressed effectively.

In a semiconductor manufacturing apparatus member according to the invention, it is also favorable for a thickness of the first particle-resistant layer to be thinner than a thickness of the second particle-resistant layer.

The first particle-resistant layer has better particle resistance than the second particle-resistant layer. For example, when the first particle-resistant layer is denser than the second particle-resistant layer, there are cases where the internal stress of the first particle-resistant layer is higher than the internal stress of the second particle-resistant layer. Accordingly, by setting the thickness of the first particle-resistant layer to be thinner than the thickness of the second particle-resistant layer, the internal stress of the first particle-resistant layer can be smaller; and discrepancies such as damage of the first particle-resistant layer at the edge portion, etc., can be suppressed.

In a semiconductor manufacturing apparatus member according to the invention, it is also favorable for a thickness of the first particle-resistant layer to be not less than 1 μm and not more than 10 μm.

By setting the thickness of the first particle-resistant layer to be sufficiently small, e.g., 10 μm or less, discrepancies such as damage of the particle-resistant layer, etc., can be reduced more effectively. Also, it is practically favorable to set the thickness to be 1 μm or more.

In a semiconductor manufacturing apparatus member according to the invention, it is also favorable for the particle-resistant layer to include at least one type selected from the group consisting of an oxide of a rare-earth element, a fluoride of a rare-earth element, and an acid fluoride of a rare-earth element.

According to the invention, the particle resistance of the particle-resistant layer can be increased.

In a semiconductor manufacturing apparatus member according to the invention, it is also favorable for the rare-earth element to be at least one type selected from the group consisting of Y, Sc, Yb, Ce, Pr, Eu, La, Nd, Pm, Sm, Gd, Tb, Dy, Ho, Er, Tm, and Lu.

According to the invention, the particle resistance of the particle-resistant layer can be increased further.

In a semiconductor manufacturing apparatus member according to the invention, it is also favorable for an average crystallite size of the polycrystalline ceramic calculated using a TEM image having a magnification of 400,000 times to 2,000,000 times to be not less than 3 nm and not more than 50 nm.

According to the invention, the particle resistance of the particle-resistant layer can be increased.

In a semiconductor manufacturing apparatus member according to the invention, it is also favorable for an average crystallite size of the polycrystalline ceramic in the first particle-resistant layer calculated using a TEM image having a magnification of 400,000 times to 2,000,000 times to be smaller than an average crystallite size of the polycrystalline ceramic in the second particle-resistant layer calculated using a TEM image having a magnification of 400,000 times to 2,000,000 times.

According to the invention, the particle resistance of the first particle-resistant layer can be higher than the particle resistance of the second particle-resistant layer.

In a semiconductor manufacturing apparatus member according to the invention, it is also favorable for an arithmetic average height Sa1 of the first particle-resistant layer after a reference plasma resistance test to be smaller than an arithmetic average height Sa2 of the second particle-resistant layer after the reference plasma resistance test.

According to the invention, a high level of particle resistance can be provided.

In a semiconductor manufacturing apparatus member according to the invention, it is also favorable for the first particle-resistant layer and the second particle-resistant layer each to have arithmetic average heights Sa of 0.060 or less after a reference plasma resistance test.

According to the invention, a high level of particle resistance can be provided.

A semiconductor manufacturing apparatus according to the invention includes a chamber, at least one of the semiconductor manufacturing apparatus members recited above, and an electrostatic chuck. The chamber includes an interior wall forming a space where plasma is generated; the interior wall includes a lower interior wall where the electrostatic chuck is disposed, and an upper interior wall disposed higher than the lower interior wall; and the particle-resistant layer of the semiconductor manufacturing apparatus member is included in at least a portion of the upper interior wall.

According to the semiconductor manufacturing apparatus of the invention, a high level of particle resistance can be provided.

A display manufacturing apparatus according to the invention includes at least one of the semiconductor manufacturing apparatus members recited above.

According to the display manufacturing apparatus of the invention, a high level of particle resistance can be provided.

Embodiments of the invention will now be described with reference to the drawings. Similar components in the drawings are marked with the same reference numerals; and a detailed description is omitted as appropriate.

Figure 1:
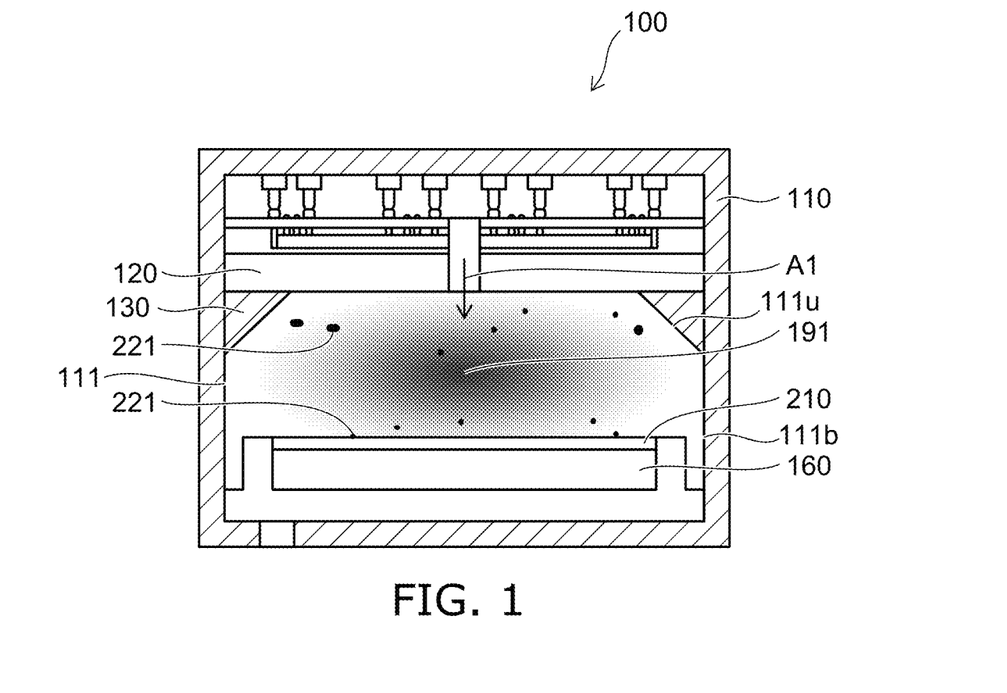
FIG. 1 is a cross-sectional view illustrating a semiconductor manufacturing apparatus including a semiconductor manufacturing apparatus member according to an embodiment.

FIG. 1 is a cross-sectional view illustrating a semiconductor manufacturing apparatus including a semiconductor manufacturing apparatus member according to an embodiment.

The semiconductor manufacturing apparatus 100 illustrated in FIG. 1 includes a chamber 110, a top plate 120, a semiconductor manufacturing apparatus member 130, and an electrostatic chuck 160. The top plate 120 is provided in the upper part inside the chamber 110. The electrostatic chuck 160 is provided in the lower part inside the chamber 110. That is, the top plate 120 is provided above the electrostatic chuck 160 inside the chamber 110. An object to be chucked such as a wafer 210 or the like is placed on the electrostatic chuck 160.

An interior wall 111 of the chamber 110 includes a lower interior wall 111b where the electrostatic chuck 160 is disposed, and an upper interior wall 111u disposed higher than the lower interior wall 111b. In the example, the interior wall 111 of the chamber 110 is configured in a tapered configuration in which the diameter decreases upward. In other words, the diameter of the upper side of the chamber 110 contacting the top plate 120 is smaller than the diameter of the lower side of the chamber 110 at the electrostatic chuck 160 side. For example, the semiconductor manufacturing apparatus member 130 is disposed to contact the top plate 120.

In the semiconductor manufacturing apparatus 100, high frequency power is supplied; and, for example, a source gas such as a halogen-based gas or the like is introduced to the interior of the chamber 110 as in arrow A1 illustrated in FIG. 1. Then, the source gas that is introduced to the interior of the chamber 110 is plasmatized in a region 191 between the electrostatic chuck 160 and the top plate 120.

Here, if particles 221 produced in the chamber 110 adhere to the wafer 210, there are cases where discrepancies occur in the manufactured semiconductor device. Then, there are cases where the productivity and the yield of the semiconductor device decrease. Therefore, plasma resistance is necessary for the top plate 120 and/or the semiconductor manufacturing apparatus member 130.

The semiconductor manufacturing apparatus member according to the embodiment may be a member disposed in the chamber periphery and/or at a position other than the upper part in the chamber. Also, the semiconductor manufacturing apparatus in which the semiconductor manufacturing apparatus member is used is not limited to the example of FIG. 1 and includes any semiconductor manufacturing apparatus (semiconductor processing apparatus) performing processing such as annealing, etching, sputtering, CVD, etc.

Figure 2A:
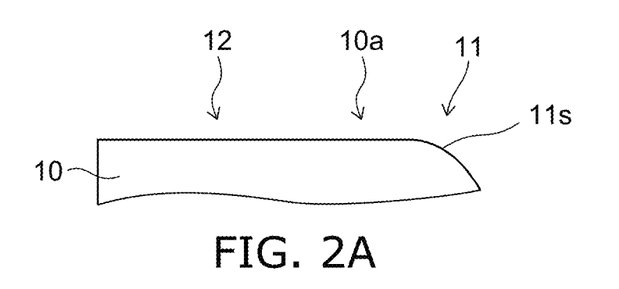
FIGS. 2A and 2B are schematic cross-sectional views illustrating the semiconductor manufacturing apparatus member according to the embodiment.
Figure 2B:
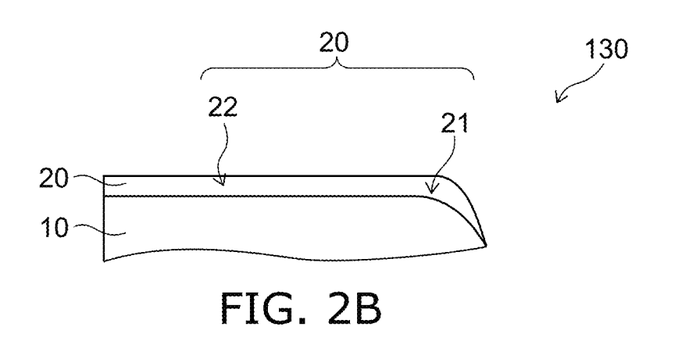

FIGS. 2A and 2B are schematic cross-sectional views illustrating the semiconductor manufacturing apparatus member according to the embodiment.

FIG. 2A is a schematic cross-sectional view for describing a base 10 of a portion of the semiconductor manufacturing apparatus member 130. FIG. 2B is a schematic cross-sectional view showing the portion of the semiconductor manufacturing apparatus member 130.

As shown in FIGS. 2A and 2B, the semiconductor manufacturing apparatus member 130 includes the base 10 and a particle-resistant layer 20.

The base 10 includes a first portion 11 and a second portion 12. The base 10 has a surface 10a. The first portion 11 includes an edge portion 11s. As shown in FIGS. 2A and 2B, the edge portion 11s has an upwardly convex configuration. The edge portion 11s is, for example, an R-surface. The second portion 12 is configured to be a planar surface in the cross-sectional view.

The particle-resistant layer 20 covers the surface 10a of the base 10. The particle-resistant layer 20 includes a polycrystalline ceramic. The particle-resistant layer 20 includes a first particle-resistant layer 21 and a second particle-resistant layer 22. The first particle-resistant layer 21 is provided at the surface of the edge portion 11s of the first portion 11. The second particle-resistant layer 22 is provided at the surface of the second portion 12. In the semiconductor manufacturing apparatus member 130, the particle resistance of the first particle-resistant layer 21 is higher than the particle resistance of the second particle-resistant layer 22.

In this specification, "high particle resistance" means that the amount of particles produced by the plasma irradiation corroding the particle-resistant layer is low. For example, a high particle resistance can be determined from a small consumed amount of the particle-resistant layer, a small change of the surface roughness of the particle-resistant layer, etc. In this specification, it is favorable for the "particle resistance" to be determined using a "luminance Sa" described below as an index.

Figure 3:
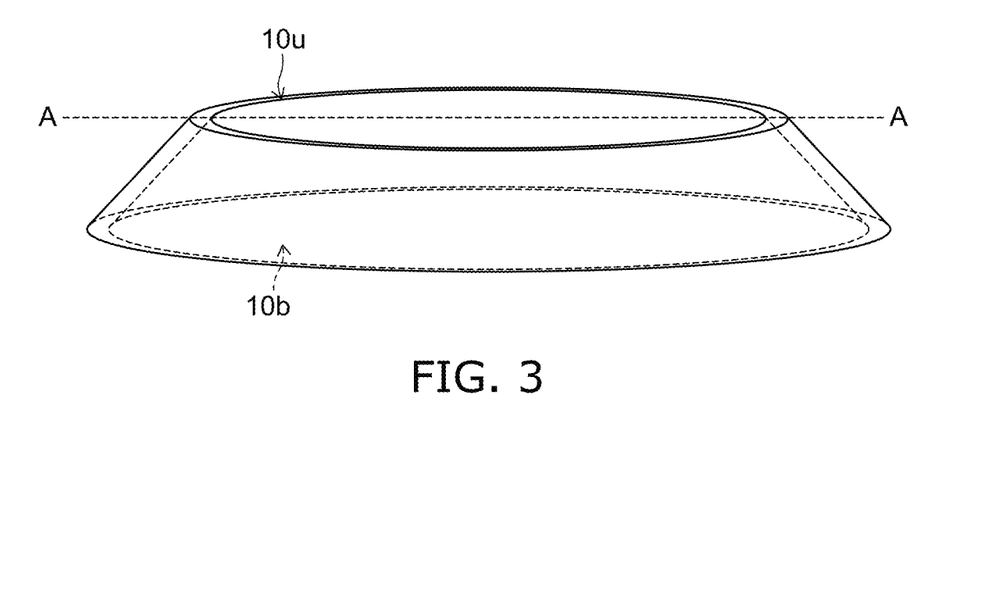
FIG. 3 is a schematic cross-sectional view illustrating the semiconductor manufacturing apparatus member according to the embodiment.

FIG. 3 is a schematic cross-sectional view illustrating the semiconductor manufacturing apparatus member according to the embodiment.

Figure 4:
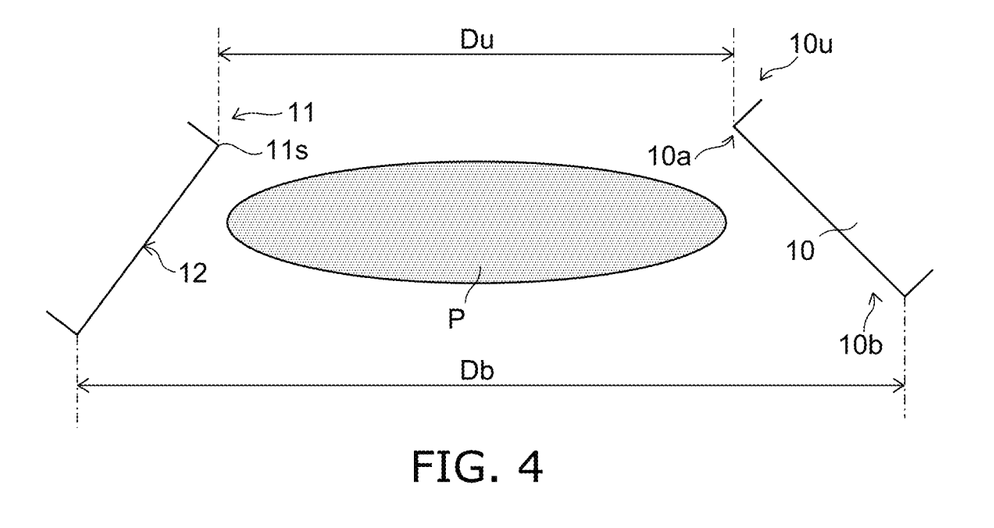
FIG. 4 is a schematic cross-sectional view illustrating the interior cut by a broken line A-A in FIG. 3.

FIG. 4 is a schematic cross-sectional view illustrating the interior cut by a broken line A-A in FIG. 3.

In the semiconductor manufacturing apparatus member 130, the base 10 may have a ring configuration; and the surface 10a of the base 10 may be included in the inner portion of the ring-shaped base 10. As shown in FIG. 3, the inner portion of the ring-shaped base 10 is the surface 10a. The particle-resistant layer 20 is provided at the surface 10a (the particle-resistant layer 20 is not illustrated in FIG. 3).

As shown in FIG. 3 and FIG. 4, the ring-shaped base 10 includes an upper side 10u and a lower side 10b. A diameter Du of the upper side 10u is shorter than a diameter Db of the lower side 10b. For example, the ring-shaped base 10 is configured in a tapered configuration in which the diameter decreases from the lower side 10b toward the upper side 10u. In the ring-shaped base 10 as shown in FIG. 4, the upper side 10u of the base 10 corresponds to the edge portion 11s of the first portion 11.

By providing the base 10 with a ring configuration, the base 10 can be utilized favorably as an interior wall of the semiconductor manufacturing apparatus member 130. In the semiconductor manufacturing apparatus, there are cases where the interior wall at the upper side of the chamber is configured in a tapered configuration in which the diameter decreases upward. The inventors discovered that in such a case, the contact area between a plasma atmosphere P and particularly the upper side 10u of the base 10 increases in some cases (referring to FIG. 4).

When the base 10 of the semiconductor manufacturing apparatus member 130 has a ring configuration, for example, the upper side 10u may be the edge portion 11s and may be covered with the first particle-resistant layer 21 which has superior particle resistance. The decrease of the particle resistance can be suppressed effectively thereby.

In the semiconductor manufacturing apparatus member 130, the thickness of the first particle-resistant layer 21 is, for example, thinner than the thickness of the second particle-resistant layer 22. In the semiconductor manufacturing apparatus member 130, the first particle-resistant layer 21 has better particle resistance than the second particle-resistant layer 22. For example, when the first particle-resistant layer 21 is more dense than the second particle-resistant layer 22, there are cases where the internal stress of the first particle-resistant layer 21 is higher than the internal stress of the second particle-resistant layer 22. Accordingly, by setting the thickness of the first particle-resistant layer 21 to be thinner than the thickness of the second particle-resistant layer 22, the internal stress of the first particle-resistant layer 21 can be smaller; and discrepancies such as damage of the first particle-resistant layer 21 at the edge portion 11s, etc., can be suppressed.

The edge effect is considered to be the reason that the plasma concentrates easily at the edge portion 11s. The edge effect is a phenomenon in which the plasma concentrates due to a large electric field strength at a sharp portion at the periphery of an electrode plate for electric discharge using parallel plate electrodes or at a protrusion of an unevenness in the electrode surface.

The thickness of the first particle-resistant layer 21 is, for example, not less than 1 μm and not more than 10 μm, and more favorably not less than 1 μm and not more than 5 μm, and more favorably not less than 1 μm and not more than 3 μm. By setting the thickness of the first particle-resistant layer 21 to be sufficiently small, e.g., 10 μm or less, discrepancies such as the damage of the first particle-resistant layer 21, etc., can be reduced more effectively. Also, it is practically favorable for the thickness of the first particle-resistant layer 21 to be 1 μm or more. The thickness of the first particle-resistant layer 21 is the length of the particle-resistant layer 20 in a direction orthogonal to a tangent of the edge portion 11s of the base 10.

The thickness of the second particle-resistant layer 22 is, for example, not less than 1 μm and not more than 10 μm. The thickness of the second particle-resistant layer 22 is the length of the particle-resistant layer 20 in a direction orthogonal to a tangent of the second portion 12 of the base 10.

In the specification, the thickness of the particle-resistant layer 20 (the first particle-resistant layer 21 and the second particle-resistant layer 22) is determined as follows.

The thickness can be confirmed by cutting the semiconductor manufacturing apparatus member 130 and observing the fractured surface by using a scanning electron microscope (SEM). For example, SEM may be performed using the HITACHI S-5500 and the SEM observation conditions of a magnification of 5000 times and an acceleration voltage of 15 kV. When there is fluctuation of the thickness of the cross-sectional image, multiple locations are measured; and the average value of the multiple locations is calculated.

The base 10 may be any of a metal, a ceramic, glass, a plastic, or a combination of these substances. It is favorable for the base 10 to be a metal or a ceramic. The metal may include an aluminum alloy or aluminum having a surface on which anodic oxidation (alumite processing) is performed. The ceramic may include aluminum oxide, aluminum nitride, etc.

The particle-resistant layer 20 includes a polycrystalline ceramic. The particle-resistant layer 20 includes, for example, at least one type selected from the group consisting of an oxide of a rare-earth element, a fluoride of a rare-earth element, and an acid fluoride of a rare-earth element. For example, at least one type selected from the group consisting of Y, Sc, Yb, Ce, Pr, Eu, La, Nd, Pm, Sm, Gd, Tb, Dy, Ho, Er, Tm, and Lu are examples of the rare-earth element. More specifically, the particle-resistant layer 20 includes at least one type selected from the group consisting of an oxide of yttrium ($Y_2O_3$ or $Y_\alpha O_\beta$ (having a nonstoichiometric composition)), an yttrium oxyfluoride (YOF, $Y_5O_4F_7$, $Y_6O_5F_8$, $Y_7O_6F_9$, or $Y_{17}O_{14}F_{23}$), $(YO_{0.826}F_{0.17})F_{1.174}$, $YF_3$, $Er_2O_3$, $Gd_2O_3$, $Nd_2O_3$, $Y_3Al_5O_{12}$, $Y_4Al_2O_9$, $Y_2O_3$—$ZrO_2$, $Er_3Al_5O_{12}$, $Gd_3Al_5O_{12}$, $Er_4Al_2O_9$, $ErAlO_3$, $Gd_4Al_2O_9$, $GdAlO_3$, $Nd_3Al_5O_{12}$, $Nd_4Al_2O_9$, and $NdAlO_3$. The particle-resistant layer 20 may include at least one type selected from the group consisting of Fe, Cr, Zn, and Cu.

For example, the particle-resistant layer 20 includes yttrium and at least one of fluorine or oxygen. For example, yttrium oxide ($Y_2O_3$), yttrium fluoride ($YF_3$), or yttrium oxyfluoride (YOF) is a major component of the particle-resistant layer 20.

In the specification, "major component" refers to the inclusion of more than 50% of the component, and favorably 70% or more, more favorably 90% or more, more favorably 95% or more, and most favorably 100%. Here, "%" is, for example, the mass %.

Or, the particle-resistant layer 20 may be a compound other than an oxide, a fluoride, or an oxyfluoride. Specifically, a compound (a chloride or a bromide) including Cl element and/or Br element are examples.

The semiconductor manufacturing apparatus member 130 according to the invention has a configuration in which the particle resistance of the first particle-resistant layer 21 is higher than the particle resistance of the second particle-resistant layer 22. The first particle-resistant layer 21 and the second particle-resistant layer 22 may have the same composition; and, for example, the particle resistance may be controlled by controlling the nanolevel fine structure. Also, the first particle-resistant layer 21 and the second particle-resistant layer 22 may have different compositions; and the particle resistance of the first particle-resistant layer 21 may be higher than the particle resistance of the second particle-resistant layer 22.

The semiconductor manufacturing apparatus member 130 has a configuration in which the particle resistance of the first particle-resistant layer 21 is higher than the particle resistance of the second particle-resistant layer 22. The "particle resistance" can be evaluated using the "reference plasma resistance test" described below as one reference technique. For the semiconductor manufacturing apparatus member 130, the arithmetic average height Sa1 of the first particle-resistant layer 21 after the reference plasma resistance test is smaller than the arithmetic average height Sa2 of the second particle-resistant layer 22 after the reference plasma resistance test. It is favorable for the arithmetic average height Sa1 of the first particle-resistant layer 21 after the reference plasma resistance test to be 0.060 or less, and more favorably 0.020 or less, and more favorably 0.016 or less.

The reference plasma resistance test will now be described in detail.

An inductively coupled plasma reactive ion etching apparatus (the Muc-21Rv-Aps-Se/made by Sumitomo Precision Products Co.) is used as the plasma etching apparatus for the reference plasma resistance test. The conditions of the plasma etching include an ICP (Inductively Coupled Plasma) output of 1500 W as the power supply output, a bias output of 750 W, a gas mixture of $CHF_3$ gas at 100 ccm and $O_2$ gas at 10 ccm as the process gas, a pressure of 0.5 Pa, and a plasma etching time of 1 hour. The state of the surface of the semiconductor manufacturing apparatus member 130 (the surface of the particle-resistant layer 20) after plasma irradiation is imaged using a laser microscope (e.g., the OLS4500/made by Olympus). The details of the observation conditions, etc., are described below. The arithmetic average height Sa of the surface after plasma irradiation is calculated from the obtained image. Here, the arithmetic average height Sa is the two-dimensional arithmetic average roughness Ra extended three-dimensionally, and is a three-dimensional roughness parameter (a three-dimensional height direction parameter). Specifically, the arithmetic average height Sa is the volume of the portion surrounded with the surface-height surface and the mean plane divided by the measured area. In other words, the arithmetic average height Sa is defined by the following formula, in which the mean plane is the xy plane, the vertical direction is the z-axis, and the measured surface-height curve is z(x,y). Here, "A" in Formula (1) is the measured area.

[Formula 1]

$$Sa = \frac{1}{A} \int \int_A |z(x, y)| dx dy \qquad \text{Formula (1)}$$

Although the value of the arithmetic average height Sa basically is independent of the measurement technique, the calculations of the "reference plasma resistance test" of the specification are performed under the following conditions. A laser microscope is used to calculate the arithmetic average height Sa. Specifically, the laser microscope "OLS4500/made by Olympus" is used. An objective lens of the MPLAPON100xLEXT (a numerical aperture of 0.95, a working distance of 0.35 mm, a focus spot diameter of 0.52 µm, and a measurement region of 128×128 µm) is used; and the magnification is set to 100 times. The λc filter of the waviness component removal is set to 25 µm. The measurement is performed at any three locations; and the average value is used as the arithmetic average height Sa. Otherwise, the three-dimensional surface texture international standard ISO 25178 is referred to as appropriate.

The sample for the reference plasma resistance test is cut appropriately to a size fitting into the chamber of an etching apparatus. For example, a sample that is cut to include the first particle-resistant layer 21 and a sample that is cut to include the second particle-resistant layer 22 are prepared; and the reference plasma resistance test is performed for these samples.

It is favorable to use the "luminance Sa" as the index of the "particle resistance". Here, the "luminance Sa" is an index obtained by quantifying the pixel information of a digital black and white image of a bright field image of a structural component obtained by a transmission electron microscope (TEM), and is an index that can be evaluated a structural component having an extremely small porosity (0.01 to 0.1%) and even finer structures (e.g., nanolevel). The particle resistance is better as the luminance Sa decreases. The "luminance Sa" is an application of the concept of the arithmetic average height Sa to the image processing of a digital TEM image.

For example, the luminance Sa is calculated as follows.

To calculate the luminance Sa, the TEM observation sample for acquiring the digital black and white image is made using a focused-ion beam (FIB) to suppress processing damage. A carbon layer and a tungsten layer are provided on the surface of the structural component for static electricity prevention and sample protection in the FIB processing. The sample upper portion thickness which is the short-axis direction length of the structural component surface in a plane perpendicular to the vertical direction is set to 100±30 nm when the FIB processing direction is taken to be the vertical direction. At least three TEM observation samples are prepared from one structural component.

A digital black and white image is acquired for each of the at least three TEM observation samples. The digital black and white image is acquired using a transmission electron microscope (TEM) having a magnification of 100,000 times and an acceleration voltage of 200 kV. The digital black and white image includes the structural component, the carbon layer, and the tungsten layer.

A luminance acquisition region that has a region vertical length of 0.5 µm in the vertical direction from the structural component surface is set in the digital black and white image. Multiple digital black and white images are acquired from each of the at least three TEM observation samples so that the total of the surface area of the luminance acquisition region is not less than 6.9 µm².

The luminance values for each pixel in the acquired digital black and white image which are color data represented by gradation numerical values are corrected relatively by setting the luminance value of the carbon layer to 255 and the luminance value of the tungsten layer to 0.

The luminance Sa is calculated as follows using the corrected luminance values. Namely, for each of the luminance acquisition regions, the least-squares method is used to calculate the average of the absolute value of the difference of the luminance values after correcting for each pixel; and the average of these values is used as the luminance Sa. For the details of the luminance Sa, for example, JP Patent No. 6597922 is hereby incorporated by reference.

In the invention, the luminance Sa of the first particle-resistant layer 21 is smaller than the luminance Sa of the second particle-resistant layer 22.

According to one aspect of the invention, it is favorable for the surface 10a of the base 10 where the particle-resistant layer 20 is provided to be smooth. According to one aspect of the invention, the unevenness of the surface is removed by performing, for example, at least one of blasting, physical polishing, chemical mechanical polishing, lapping, or chemical polishing of the surface 10a of the base 10. For example, it is favorable for such an unevenness removal to be performed so that the resulting surface 10a is such that the arithmetic average roughness Ra is 0.2 µm or less, and more favorably 0.1 µm or less, or such that a maximum height roughness Rz is 3 µm or less. The arithmetic average roughness Ra and the maximum height roughness Rz conform to JIS B 0601:2001 and can be measured by, for example, the surface roughness measuring instrument "SURFCOM130A/made by Tokyo Seimitsu Co."

For example, the particle-resistant layer 20 (the first particle-resistant layer 21 and the second particle-resistant layer 22) can be formed by "aerosol deposition". "Aerosol deposition" is a method of forcing an "aerosol" including fine particles including a brittle material dispersed in a gas from a nozzle toward a base such as a metal, glass, a ceramic, a plastic, etc., causing the brittle material fine particles to collide with the base, causing the fine particles to deform and fragment due to the impact of the collisions, and causing the fine particles to bond to directly form a layer structural component (also called a film structural component) made of the constituent materials of the fine particles on the base.

In the example, for example, an aerosol that is a mixture of a gas and fine particles of a ceramic material such as yttria or the like having excellent particle resistance is forced toward the base 10 to form the layer structural component (the particle-resistant layer 20).

According to aerosol deposition, a heating unit, a cooling unit, or the like is not particularly necessary; it is possible to form the layer structural component at room temperature;

and a layer structural component that has a mechanical strength equal to or greater than that of a sintered body can be obtained. Also, it is possible to diversely change the density, the fine structure, the mechanical strength, the electrical characteristics, etc., of the layer structural component by controlling the configuration and the composition of the fine particles, the conditions causing the fine particles to collide, etc.

For example, the particle resistance of the first particle-resistant layer 21 can be set to be higher than the particle resistance of the second particle-resistant layer 22 by appropriately controlling the conditions recited above.

In this specification, "polycrystal" refers to a structure body in which crystal particles are bonded/integrated. A crystal substantially includes one crystal particle. Normally, the diameter of the crystal particle is 5 nanometers (nm) or more. However, the crystal particles are a polycrystal in the case where fine particles are incorporated into the structural component without fragmenting.

In the semiconductor manufacturing apparatus member 130, the particle-resistant layer 20 (the first particle-resistant layer 21 and the second particle-resistant layer 22) may include only a polycrystalline ceramic or may include a polycrystalline ceramic and an amorphous ceramic.

The average crystallite size of the polycrystalline ceramic in the particle-resistant layer 20 (the first particle-resistant layer 21 and the second particle-resistant layer 22) is not less than 3 nm and not more than 50 nm. It is favorable for the upper limit of the crystallite size to be 30 nm, and more favorably 20 nm, and more favorably 15 nm. A favorable lower limit of the crystallite size is 5 nm.

In the semiconductor manufacturing apparatus member 130, the average crystallite size of the first particle-resistant layer 21 is, for example, smaller than the average crystallite size of the second particle-resistant layer 22. Thereby, for example, the particle resistance of the first particle-resistant layer 21 is higher than the particle resistance of the second particle-resistant layer 22.

In the invention, the "average crystallite size" can be determined by the following method.

First, a transmission electron microscope (TEM) image is imaged using not less than a magnification of 400,000 times. The average value of the diameters of fifteen crystallites calculated using a circle approximation in the image is used as the average crystallite size. At this time, the crystallite can be discriminated more clearly by setting the sample thickness in the FIB processing to be sufficiently thin, e.g., about 30 nm. The imaging magnification can be selected as appropriate in the range of 400,000 times or more.

Also, in this specification, in the case where the primary particle is a dense particle, "fine particle" refers to an average particle size of 5 micrometers (μm) or less when identified by a particle size distribution measurement, a scanning electron microscope, etc. In the case where the primary particle is a porous particle easily fragmented by impacting, "fine particle" refers to an average particle size of 50 μm or less.

In this specification, "aerosol" refers to a solid-gas mixed phase substance in which the fine particles described above are dispersed in a gas such as helium, nitrogen, argon, oxygen, dry air, a gas mixture including such elements, etc.; and although there are also cases where an "agglomerate" is partially included, "aerosol" refers to the state in which the fine particles are dispersed substantially solitarily. Although the gas pressure and the temperature of the aerosol are arbitrary when forming the layer structural component, it is desirable for the concentration of the fine particles in the gas at the timing when forced from the discharge aperture to be within the range of 0.0003 mL/L to 5 mL/L when the gas pressure is converted to 1 atmosphere and the temperature is converted to 20 degrees Celsius.

One feature of the process of aerosol deposition is that the process normally is performed at room temperature, and the formation of the layer structural component is possible at a temperature that is sufficiently lower than the melting point of the fine particle material, that is, several hundred degrees Celsius or less.

In this specification, "room temperature" refers to a temperature that is markedly lower than the sintering temperature of a ceramic, and refers to an environment of substantially 0 to 100° C.; and a room temperature of about 20° C.±10° C. is most general.

For the fine particles included in the powder body used as the source material of the layer structural component, a brittle material such as a ceramic, a semiconductor, etc., can be used as a major body, and fine particles of the same material can be used solitarily or fine particles having different particle sizes can be mixed; and it is possible to mix, combine, and use different types of brittle material fine particles. It is also possible to use fine particles of a metal material, an organic material, etc., by mixing the fine particles of the metal material, the organic material, etc., with the brittle material fine particles and coating the fine particles of the metal material, the organic material, etc., onto the surfaces of the brittle material fine particles. Even in such cases, the brittle material is the major part of the formation of the layer structural component.

For the hybrid structural component formed by such techniques, in the case where crystalline brittle material fine particles are used as the source material, the portion of the layer structural component of the hybrid structural component is a polycrystalline body having a small crystal particle size compared to the source material fine particles; and there are many cases where the crystals of the polycrystalline body have substantially no crystal orientation. A grain boundary layer that is made of a glass layer substantially does not exist at the interface between the brittle material crystals. In many cases, the layer structural component portion of the hybrid structural component forms an "anchor layer" that sticks into the surface of the base (in the example, the base 10). The layer structural component, in which the anchor layer is formed, is formed and adhered securely to the base with exceedingly high strength.

A layer structural component that is formed by aerosol deposition possesses sufficient strength and is clearly different from a so-called "powder compact" having a state in which the fine particles are packed together by pressure and the form is maintained by physical adhesion.

For aerosol deposition, it can be confirmed that fragmentation/deformation occurs for the brittle material fine particles flying onto the base by using X-ray diffraction, etc., to measure the size of the brittle material fine particles used as the source material and the crystallite (crystal particle) size of the brittle material structural component that is formed. In other words, the crystallite size of the layer structural component formed by aerosol deposition is smaller than the crystallite size of the source material fine particles. "New major surfaces" are formed at the "shift surfaces" and/or the "fracture surfaces" formed by the fine particles fragmenting and/or deforming; and the "new major surfaces" are in the state in which atoms that existed in the interior of the fine particle and were bonded to other atoms are exposed. It is considered that the layer structural component is formed by the new major surfaces, which are active and have high surface energy, being bonded to the surfaces of adjacent brittle material fine particles, bonded to new major surfaces of adjacent brittle materials, or bonded to the front surface of the base.

In the case where an appropriate amount of hydroxide groups exists at the surfaces of the fine particles in the aerosol, it also may be considered that the bonding occurs due to mechano-chemical acid-base dehydration reactions occurring due to local shifting stress, etc., between the fine particles or between the structural component and the fine particles when the fine particles collide. It is considered that adding a continuous mechanical impact force from the outside causes these phenomena to occur continuously; the progression and densification of the bonds occur due to the repetition of the deformation, the fragmentation, etc., of the fine particles; and the layer structural component that is made of the brittle material grows.

For example, when the particle-resistant layer 20 is formed by aerosol deposition, the particle-resistant layer 20 which is a ceramic layer has a dense fine structure in which the crystallite size is small compared to a ceramic sintered body, a thermal-sprayed film, etc. Thereby, the particle resistance of the semiconductor manufacturing apparatus member 130 according to the embodiment is higher than the particle resistance of a sintered body or a thermal-sprayed film. Also, the probability of the semiconductor manufacturing apparatus member 130 according to the embodiment being a production source of particles is lower than the probability of a sintered body, a thermal-sprayed film, etc., being a production source of particles.

An example of the semiconductor manufacturing apparatus member 130 according to the invention being manufactured by, for example, aerosol deposition and an apparatus used for the manufacturing will now be described. The apparatus that is used for the aerosol deposition includes a chamber, an aerosol supplier, a gas supplier, an exhaust part, and a pipe. For example, a stage where the base 10 is disposed, a driver, and a nozzle are disposed in the chamber. The positions of the nozzle and the base 10 disposed on the stage can be changed relatively by the driver. At this time, the distance between the nozzle and the base 10 may be constant or may be changeable. Although an aspect in which the driver drives the stage is shown in the example, the driver may drive the nozzle. The drive directions are, for example, the XYZθ-directions.

The aerosol supplier is connected with the gas supplier by a pipe. In the aerosol supplier, an aerosol in which a gas and source material fine particles are mixed is supplied to the nozzle via the pipe. The apparatus further includes a powder body supplier supplying the source material fine particles. The powder body supplier may be disposed in the aerosol supplier or may be disposed separately from the aerosol supplier. Also, an aerosol former that mixes the source material fine particles and the gas may be included separately from the aerosol supplier. A homogeneous structural component can be obtained by controlling the supply amount from the aerosol supplier so that the amount of the fine particles forced from the nozzle is constant.

The gas supplier supplies nitrogen gas, helium gas, argon gas, air, etc. Although compressed air in which, for example, impurities such as moisture, oil, etc., are low is used in the case where the supplied gas is air, it is favorable to further provide an air processor to eliminate the impurities from the air.

An example of the operation of the apparatus used for the aerosol deposition will now be described. In the state in which the base 10 is disposed on the stage inside the chamber, the chamber interior is depressurized to atmospheric pressure or less, and specifically to about several hundred Pa by an exhaust part such as a vacuum pump, etc. On the other hand, the internal pressure of the aerosol supplier is set to be higher than the internal pressure of the chamber. The internal pressure of the aerosol supplier is, for example, several hundred to several tens of thousands Pa. The powder body supplier may be at atmospheric pressure. The fine particles in the aerosol are accelerated by the pressure difference between the chamber and the aerosol supplier, etc., so that the jet velocity of the source material particles from the nozzle is in the range of subsonic speed to supersonic speed (50 to 500 m/s). The jet velocity is controlled by the gas type and the flow velocity of the gas supplied from the gas supplier, the configuration of the nozzle, the length and/or the inner diameter of the pipe, the exhaust amount of the exhaust part, etc. For example, a supersonic nozzle such as a Laval nozzle, etc., also can be used as the nozzle. The fine particles in the aerosol are forced at a high speed from the nozzle, collide with the base 10, are pulverized or deformed, and are deposited on the base 10 as a structural component (the particle-resistant layer 20). By changing the relative positions of the base 10 and the nozzle, a hybrid structural component (the semiconductor manufacturing apparatus member 130) that includes a structural component (the particle-resistant layer 20) having a prescribed surface area is formed on the base 10.

Also, a pulverizer for pulverizing the agglomeration of fine particles before being forced from the nozzle may be provided. Any method can be selected as the pulverizing method of the pulverizer. For example, known methods include mechanical pulverization such as vibrating, colliding, or the like, static electricity, plasma irradiation, classification, etc.

The semiconductor manufacturing apparatus member according to the invention can be used favorably as various members in the semiconductor manufacturing apparatus, and especially as members used in an environment exposed to a corrosive high density plasma atmosphere. Specifically, a chamber wall, a shower plate, a liner, a shield, a window, an edge ring, a focus ring, etc., are examples.

Figure 5A:
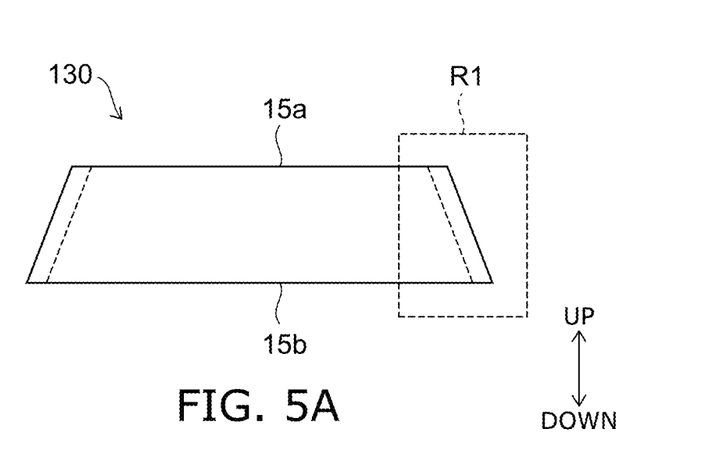
FIG. 5A and FIG. 5B are a side view and a cross-sectional view schematically illustrating an example of the semiconductor manufacturing apparatus member according to the embodiment.
Figure 5B:
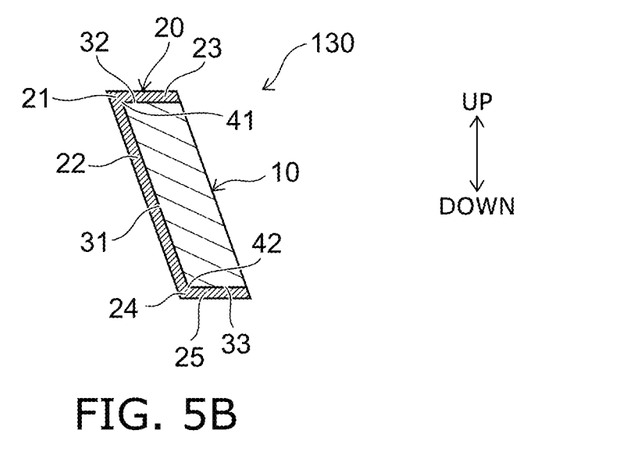

FIG. 5A and FIG. 5B are a side view and a cross-sectional view schematically illustrating an example of the semiconductor manufacturing apparatus member according to the embodiment.

FIG. 5B is a side cross-sectional view of a region R1 shown in FIG. 5A.

In the example as illustrated in FIG. 5A and FIG. 5B, the base 10 includes a first surface 31, a second surface 32, a third surface 33, a first edge portion 41, and a second edge portion 42.

The first surface 31 is, for example, a curved surface. The first surface 31 may be a planar surface. The second surface 32 crosses the first surface 31. That is, the second surface 32 is not a surface parallel to the first surface 31. The second surface 32 is, for example, a planar surface. The second surface 32 may be a curved surface. The first edge portion 41 connects the first surface 31 and the second surface 32. That is, the first edge portion 41 is a convex corner portion (an outside corner) between the first surface 31 and the second surface 32.

The third surface 33 crosses the first surface 31. That is, the third surface 33 is not a surface parallel to the first surface 31. The third surface 33 is, for example, a planar surface. The third surface 33 may be a curved surface. The second edge portion 42 connects the first surface 31 and the third surface 33. That is, the second edge portion 42 is a convex corner portion (an outside corner) between the first surface 31 and the third surface 33.

The edge portion 11s is at least one of the first edge portion 41 or the second edge portion 42. The first portion 11 is, for example, a portion including the second surface 32 and the first edge portion 41. The first portion 11 may be a portion including the third surface 33 and the second edge portion 42. The second portion 12 is a portion including the first surface 31.

In the example, the base 10 has a ring configuration open through the vertical direction. The first surface 31 is the inner perimeter surface of the ring-shaped base 10. That is, the first surface 31 is the side surface of the base 10 on the inner side, and is a surface positioned at the inner side of the chamber. The second surface 32 is the upper surface of the ring-shaped base 10. The first edge portion 41 is the corner portion at the inner upper end of the ring-shaped base 10. The third surface 33 is the lower surface of the ring-shaped base 10. The second edge portion 42 is the corner portion at the inner lower end of the ring-shaped base 10.

The second surface 32 may be the lower surface of the ring-shaped base 10. In such a case, the first edge portion 41 is the corner portion at the inner lower end of the ring-shaped base 10. Similarly, the third surface 33 may be the upper surface of the ring-shaped base 10. In such a case, the second edge portion 42 is the corner portion at the inner upper end of the ring-shaped base 10.

In the example, the second surface 32 and the third surface 33 are substantially horizontal planar surfaces. The second surface 32 and the third surface 33 are not limited thereto; and each may be oblique surfaces oblique to the horizontal direction or may be curved surfaces. Although the second surface 32 and the third surface 33 are parallel to each other in the example, the second surface 32 and the third surface 33 may not be parallel to each other. The first edge portion 41 and the second edge portion 42 each may be right angles, acute angles, or obtuse angles. The first edge portion 41 may include a curved surface (an R-surface) curved from the first surface 31 toward the second surface 32. The second edge portion 42 may include a curved surface (an R-surface) curved from the first surface 31 toward the third surface 33.

The base 10 has a first opening 15a positioned at the upper end, and a second opening 15b positioned at the lower end. That is, the base 10 is a tubular configuration having openings at the end portions at the top and bottom. In the example, the diameter of the first opening 15a is smaller than the diameter of the second opening 15b. In the example, the base 10 has a tapered configuration in which the inner diameter decreases from the second opening 15b at the lower end toward the first opening 15a at the upper end. The diameter of the first opening 15a may be the same as the diameter of the second opening 15b.

The first surface 31, the second surface 32, the third surface 33, the first edge portion 41, and the second edge portion 42 of the base 10 are covered with the particle-resistant layer 20. In other words, the particle-resistant layer 20 is provided at the first surface 31, the second surface 32, the third surface 33, the first edge portion 41, and the second edge portion 42 of the base 10.

The particle-resistant layer 20 includes the first to fifth particle-resistant layers 21 to 25. The first particle-resistant layer 21 is provided at the first edge portion 41. That is, the portion of the particle-resistant layer 20 provided at the first edge portion 41 is the first particle-resistant layer 21. The second particle-resistant layer 22 is provided at the first surface 31. That is, the portion of the particle-resistant layer 20 provided at the first surface 31 is the second particle-resistant layer 22. The third particle-resistant layer 23 is provided at the second surface 32. That is, the portion of the particle-resistant layer 20 provided at the second surface 32 is the third particle-resistant layer 23. The fourth particle-resistant layer 24 is provided at the second edge portion 42. That is, the portion of the particle-resistant layer 20 provided at the second edge portion 42 is the fourth particle-resistant layer 24. The fifth particle-resistant layer 25 is provided at the third surface 33. That is, the portion of the particle-resistant layer 20 provided at the third surface 33 is the fifth particle-resistant layer 25.

The particle resistance of the first particle-resistant layer 21 is higher than the particle resistance of the second particle-resistant layer 22. The particle resistance of the first particle-resistant layer 21 is, for example, higher than the particle resistance of the third particle-resistant layer 23. The particle resistance of the third particle-resistant layer 23 is, for example, the same as the particle resistance of the second particle-resistant layer 22.

The particle resistance of the fourth particle-resistant layer 24 is, for example, higher than the particle resistance of the second particle-resistant layer 22. The particle resistance of the fourth particle-resistant layer 24 is, for example, higher than the particle resistance of the fifth particle-resistant layer 25. The particle resistance of the fourth particle-resistant layer 24 is, for example, the same as the particle resistance of the first particle-resistant layer 21. The particle resistance of the fifth particle-resistant layer 25 is, for example, the same as the particle resistance of the second particle-resistant layer 22.

The particle-resistant layer 20 is configured to include the first particle-resistant layer 21 provided at the edge portion (the first edge portion 41) and the second particle-resistant layer 22 provided at the first surface 31; and the particle resistance of the first particle-resistant layer 21 is set to be higher than the particle resistance of the second particle-resistant layer 22; thereby, the plasma damage of the edge portion (the first edge portion 41) can be reduced; and a semiconductor manufacturing apparatus member 130 that has excellent particle resistance can be provided.

By setting the particle resistance of the first particle-resistant layer 21 provided at the edge portion (the first edge portion 41) to be higher than the particle resistance of the second particle-resistant layer 22, the plasma damage of the edge portion (the first edge portion 41) can be reduced even when the base 10 has a ring configuration.

The edge portion (the first edge portion 41) that connects the upper surface (the second surface 32) and the inner perimeter surface (the first surface 31) of the ring-shaped base 10 is covered with the first particle-resistant layer 21 which has superior particle resistance; therefore, the decrease of the particle resistance can be suppressed effectively.

Figure 6A:
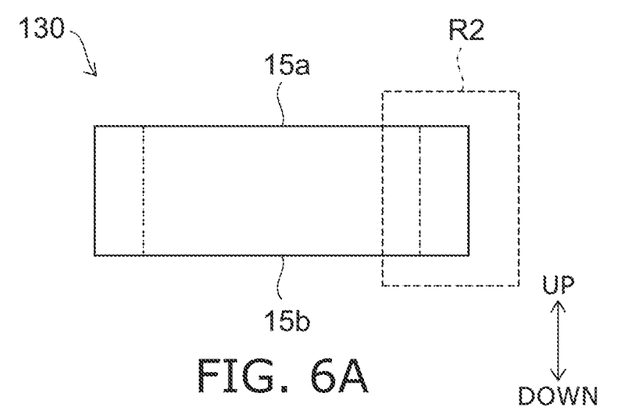
FIG. 6A and FIG. 6B are a side view and a cross-sectional view schematically illustrating an example of the semiconductor manufacturing apparatus member according to the embodiment.
Figure 6B:
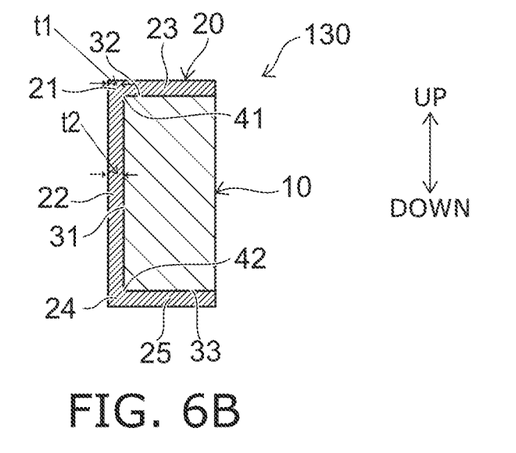

FIG. 6A and FIG. 6B are a side view and a cross-sectional view schematically illustrating an example of the semiconductor manufacturing apparatus member according to the embodiment.

FIG. 6B is a side cross-sectional view of a region R2 shown in FIG. 6A. As shown in FIG. 6B, a thickness of the first particle-resistant layer 21 is represented by t1 and a thickness of the second particle-resistant layer 22 is represented by t2. The thickness t1 of the first particle-resistant layer 21 is less than the thickness t2 of the second particle-resistance layer 22. In other words, the thickness t1 of the first particle-resistant layer 21 is thinner than the thickness t2 of the second particle-resistant layer 22.

In the example as illustrated in FIG. 6A and FIG. 6B, the base 10 has a ring configuration open straight through vertically (that is, not in a tapered configuration). The first surface 31 is the inner perimeter surface of the ring-shaped base 10. The second surface 32 is the upper surface of the ring-shaped base 10. The first edge portion 41 is the corner portion at the inner upper end of the ring-shaped base 10. The third surface 33 is the lower surface of the ring-shaped base 10. The second edge portion 42 is the corner portion at the inner lower end of the ring-shaped base 10.

The base 10 has the first opening 15a positioned at the upper end, and the second opening 15b positioned at the lower end. The diameter of the first opening 15a is the same as the diameter of the second opening 15b.

Similarly to the example shown in FIG. 5A and FIG. 5B, the first surface 31, the second surface 32, the third surface 33, the first edge portion 41, and the second edge portion 42 of the base 10 are covered with the particle-resistant layer 20. The particle-resistant layer 20 includes the first to fifth particle-resistant layers 21 to 25.

The particle resistance of the first particle-resistant layer 21 is higher than the particle resistance of the second particle-resistant layer 22. The particle resistance of the first particle-resistant layer 21 is, for example, higher than the particle resistance of the third particle-resistant layer 23. The particle resistance of the third particle-resistant layer 23 is, for example, the same as the particle resistance of the second particle-resistant layer 22.

The particle resistance of the fourth particle-resistant layer 24 is, for example, higher than the particle resistance of the second particle-resistant layer 22. The particle resistance of the fourth particle-resistant layer 24 is, for example, higher than the particle resistance of the fifth particle-resistant layer 25. The particle resistance of the fourth particle-resistant layer 24 is, for example, the same as the particle resistance of the first particle-resistant layer 21. The particle resistance of the fifth particle-resistant layer 25 is, for example, the same as the particle resistance of the second particle-resistant layer 22.

By setting the particle resistance of the first particle-resistant layer 21 provided at the edge portion (the first edge portion 41) to be higher than the particle resistance of the second particle-resistant layer 22, the plasma damage of the edge portion (the first edge portion 41) can be reduced even when the base 10 has a ring configuration such as that shown in FIG. 6A and FIG. 6B.

Figure 7A:
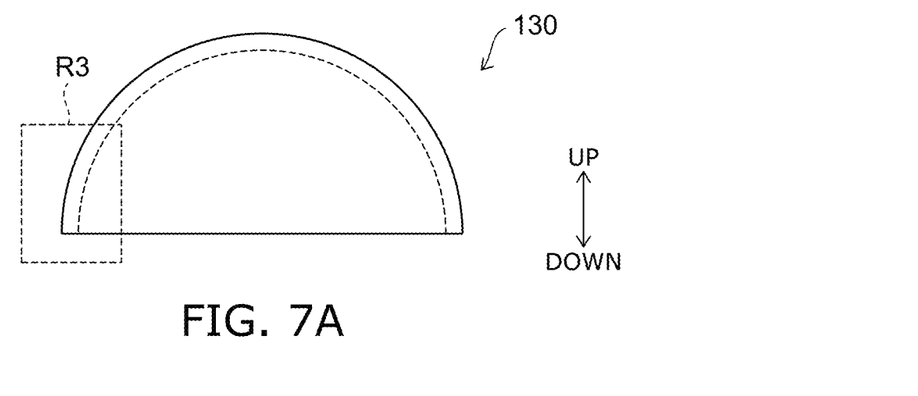
FIG. 7A and FIG. 7B are a side view and a cross-sectional view schematically illustrating another example of the semiconductor manufacturing apparatus member according to the embodiment.
Figure 7B:
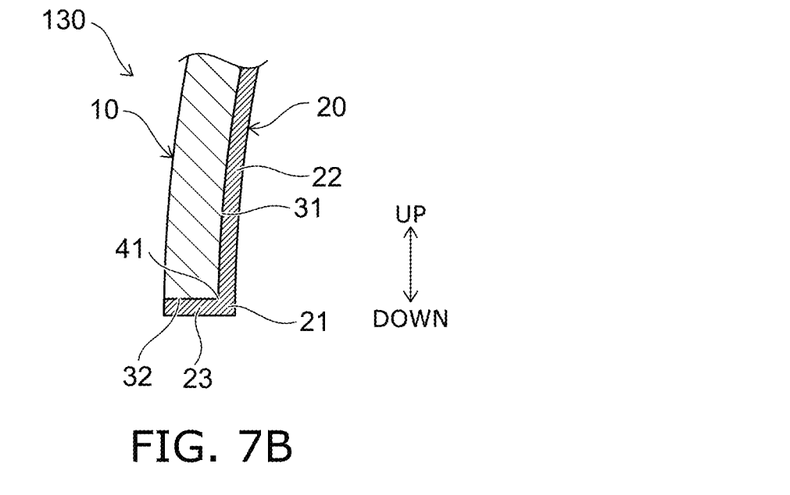

FIG. 7A and FIG. 7B are a side view and a cross-sectional view schematically illustrating another example of the semiconductor manufacturing apparatus member according to the embodiment.

FIG. 7B is a side cross-sectional view of a region R3 shown in FIG. 7A.

In the example as illustrated in FIG. 7A and FIG. 7B, the base 10 is an upwardly convex hemisphere. The first surface 31 is the inner perimeter surface of the hemispherical base 10. That is, the first surface 31 is a surface positioned at the inner side of the chamber. The second surface 32 is the lower end surface of the hemispherical base 10. The first edge portion 41 is the corner portion at the inner lower end of the hemispherical base 10.

The edge portion 11s is the first edge portion 41. The first portion 11 is, for example, a portion including the second surface 32 and the first edge portion 41. The second portion 12 is a portion including the first surface 31.

In the example, the second surface 32 is a substantially horizontal planar surface. The second surface 32 is not limited thereto, and may be an oblique surface oblique to the horizontal direction or may be a curved surface. The first edge portion 41 and the second edge portion 42 may be right angles or obtuse angles. The first edge portion 41 may include a curved surface (an R-surface) curved from the first surface 31 toward the second surface 32.

The first surface 31, the second surface 32, and the first edge portion 41 are covered with the particle-resistant layer 20. In other words, the particle-resistant layer 20 is provided at the first surface 31, the second surface 32, and the first edge portion 41.

The particle-resistant layer 20 includes the first to third particle-resistant layers 21 to 23. The first particle-resistant layer 21 is provided at the first edge portion 41. The second particle-resistant layer 22 is provided at the first surface 31. The third particle-resistant layer 23 is provided at the second surface 32.

The particle resistance of the first particle-resistant layer 21 is higher than the particle resistance of the second particle-resistant layer 22. The particle resistance of the first particle-resistant layer 21 is, for example, higher than the particle resistance of the third particle-resistant layer 23. The particle resistance of the third particle-resistant layer 23 is, for example, the same as the particle resistance of the second particle-resistant layer 22.

By setting the particle resistance of the first particle-resistant layer 21 provided at the edge portion (the first edge portion 41) to be higher than the particle resistance of the second particle-resistant layer 22, the plasma damage of the edge portion (the first edge portion 41) can be reduced even when the base 10 has a hemispherical configuration such as that shown in FIG. 7A and FIG. 7B.

Examples

Although the invention is described further using the examples recited below, the invention is not limited to these examples.

1. Sample Construction

The particle-resistant layer 20 that includes the first particle-resistant layer 21 and the second particle-resistant layer 22 was formed using the ring-shaped base 10.

1-1 Preparation of Base

As the base 10, a ring-shaped aluminum alloy base having a taper such as that shown in FIG. 3 and FIG. 4 was used.

1-2 Source Material Particle

An yttrium oxide powder body was prepared as the source material particles. The average particle size of the source material particles was 0.4 μm.

1-3 Formation of Particle-Resistant Layer

Samples 1 to 5 were obtained by covering the interior wall portion of the base recited above including the edge portion 11s with the particle-resistant layer 20 by using aerosol deposition. The construction was performed at room temperature (about 20° C.). The thickness of the particle-resistant layer 20 of the sample 1 was as shown in Table 1.

2. Sample Evaluation 2-1 Average Crystallite Size

The average crystallite size was calculated for the particle-resistant layer 20 of the sample 1. Specifically, a portion including the first particle-resistant layer 21 and a portion including the second particle-resistant layer 22 were cut out from the sample 1; and the average crystallite size was calculated from the average value of fifteen crystallites using a circle approximation in TEM images acquired at a magnification of 400,000 times. In the sample 1, the average crystallite size of the first particle-resistant layer 21 was 9 nm; and the average crystallite size of the second particle-resistant layer 22 was 12 nm.

2-2 Luminance Sa

The luminance Sa was calculated for the obtained samples 1 to 5. The calculation of the luminance Sa was performed using the method recited in Japanese Patent No. 6597922. At this time, noise removal was not performed using a low-pass filter. The results are shown in Table 2. As shown in Table 2, it was confirmed that the level of particle resistance of the second particle-resistant layer 22 was higher than that of the first particle-resistant layer 21 regardless of the compositions of the base and the particle-resistant layer.

2-3 Reference Plasma Resistance Test

A portion that includes the first particle-resistant layer 21 and a portion that includes the second particle-resistant layer 22 were cut out from the sample 1; and the reference plasma resistance test was performed.

An inductively coupled plasma reactive ion etching apparatus (the Muc-21Rv-Aps-Se/made by Sumitomo Precision Products Co.) was used as the plasma etching apparatus. The conditions of the plasma etching included an ICP output of 1500 W as the power supply output, a bias output of 750 W, a gas mixture of $CHF_3$ gas at 100 ccm and $O_2$ gas at 10 ccm as the process gas, a pressure of 0.5 Pa, and a plasma etching time of 1 hour.

Then, the state of the surfaces 202 of the first particle-resistant layer 21 and the second particle-resistant layer 22 after plasma irradiation was imaged using a laser microscope. Specifically, the laser microscope "OLS4500/made by Olympus" was used; an objective lens of the MPLAPON100xLEXT (having a numerical aperture of 0.95, a working distance of 0.35 mm, a focus spot diameter of 0.52 μm, and a measurement region of 128×128 μm) was used; and the magnification was set to 100 times. The λc filter of the waviness component removal was set to 25 μm. Measurements were performed at three arbitrary locations; and the average value was used as the arithmetic average height Sa. Otherwise, the three-dimensional surface texture international standard ISO 25178 was referred to as appropriate. The values of the arithmetic average height Sa were as shown in Table 1 for the surfaces of the first particle-resistant layer 21 and the second particle-resistant layer 22 of the sample 1 before and after the reference plasma resistance test.

TABLE 1

| PARTICLE-RESISTANT LAYER 20 | PARTICLE-RESISTANT LAYER | | ARITHMETIC AVERAGE HEIGHT Sa OF PARTICLE-RESISTANT LAYER (μm) | |
|---|---|---|---|---|
| | COMPO-SITION | THICK-NESS (μm) | BEFORE REFERENCE PLASMA RESISTANCE TEST | AFTER REFERENCE PLASMA RESISTANCE TEST |
| FIRST PARTICLE-RESISTANT LAYER 21 | $Y_2O_3$ | 7 | 0.010 | 0.016 |
| SECOND PARTICLE-RESISTANT LAYER 22 | $Y_2O_3$ | 10 | 0.012 | 0.020 |

TABLE 2

| | | | LUMINANCE Sa | |
|---|---|---|---|---|
| SAMPLE NAME | BASE MATERIAL | COMPOSITION OF PARTICLE-RESISTANT LAYER 20 | FIRST PARTICLE-RESISTANT LAYER 21 | SECOND PARTICLE-RESISTANT LAYER 22 |
| SAMPLE 1 | Al ALLOY | $Y_2O_3$ | 16 | 19 |
| SAMPLE 2 | ALUMINA | $Y_2O_3$ | 15 | 18 |
| SAMPLE 3 | ALUMITE | $Y_2O_3$ | 15 | 22 |
| SAMPLE 4 | QUARTZ | $Y_2O_3$ | 13 | 19 |
| SAMPLE 5 | QUARTZ | YOF | 16 | 23 |

For the sample 1 as shown in Table 1, the arithmetic average height Sa1 of the first particle-resistant layer 21 after the reference plasma resistance test was smaller than the arithmetic average height Sa2 of the second particle-resistant layer 22 after the reference plasma resistance test. Thereby, it was confirmed that the level of particle resistance of the second particle-resistant layer 22 is higher than that of the first particle-resistant layer 21.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, and the like of the base, the alumite layer, the particle-resistant layer, etc., can be modified appropriately and are not limited to those illustrated.

Also, the components included in the embodiments described above can be combined within the limits of technical feasibility; and such combinations also are within the scope of the invention to the extent that the features of the invention are included.

What is claimed is:
1. A semiconductor manufacturing apparatus, comprising:
a chamber including an interior wall forming a space where plasma is generated, the interior wall including a lower interior wall where an electrostatic chuck is disposed, and an upper interior wall disposed higher than the lower interior wall, the electrostatic chuck configured to support a wafer thereon,
the upper interior wall including an upper member, the upper member comprising:
a base having a ring configuration, the base including a first surface facing inside of the ring configuration thereof, a second surface crossing the first surface, a third surface crossing the first surface, a first edge portion connecting the first surface and the second surface, and a second edge portion connecting the first surface and the third surface, the second edge portion being higher than the first edge portion; and
a particle-resistant layer including a polycrystalline ceramic, the particle-resistant layer including
a first particle-resistant layer provided at the first edge portion,
a second particle-resistant layer provided at the first surface, and
a third particle-resistant layer provided at the second surface, wherein a particle resistance of the first particle-resistant layer is higher than a particle resistance of the second particle-resistant layer, wherein a thickness of the first particle-resistant layer is thinner than a thickness of the second particle-resistant layer, and wherein the first particle-resistant layer is denser than the second particle-resistant layer.

2. The semiconductor manufacturing apparatus according to claim 1, wherein the particle-resistant layer includes at least one type selected from the group consisting of an oxide of a rare-earth element, a fluoride of a rare-earth element, and an acid fluoride of a rare-earth element.

3. The semiconductor manufacturing apparatus according to claim 2, wherein the rare-earth element is at least one type selected from the group consisting of Y, Sc, Yb, Ce, Pr, Eu, La, Nd, Pm, Sm, Gd, Tb, Dy, Ho, Er, Tm, and Lu.

4. The semiconductor manufacturing apparatus according to claim 1, wherein an average crystallite size of the polycrystalline ceramic calculated using a TEM image having a magnification of 400,000 times to 2,000,000 times is not less than 3 nm and not more than 50 nm.

5. The semiconductor manufacturing apparatus according to claim 1, wherein an average crystallite size of the polycrystalline ceramic in the first particle-resistant layer calculated using a TEM image having a magnification of 400,000 times to 2,000,000 times is smaller than an average crystallite size of the polycrystalline ceramic in the second particle-resistant layer calculated using a TEM image having a magnification of 400,000 times to 2,000,000 times.

6. The semiconductor manufacturing apparatus according to claim 1, wherein the first particle-resistant layer and the second particle-resistant layer each have arithmetic average heights Sa of 0.060 or less after a reference plasma resistance test.

7. The semiconductor manufacturing apparatus according to claim 1, wherein a surface of the base where the particle-resistant layer is provided has an arithmetic average roughness Ra of 0.2 μm or less.

8. The semiconductor manufacturing apparatus according to claim 1, wherein the particle-resistant layer includes a fourth particle-resistant layer provided at the second edge portion, wherein a particle resistance of the fourth particle-resistant layer is higher than the particle resistance of the second particle-resistant layer.

* * * * *